United States Patent [19]

Ryder et al.

[11] 4,191,441
[45] Mar. 4, 1980

[54] CIRCUIT BOARD ASSEMBLY

[75] Inventors: William C. Ryder, Hadleigh; John C. Hobbs, Loughton, both of England

[73] Assignee: Ford Motor Company, Dearborn, Mich.

[21] Appl. No.: 12,083

[22] Filed: Feb. 14, 1979

[30] Foreign Application Priority Data

Feb. 24, 1978 [GB] United Kingdom ............ 07574/78

[51] Int. Cl.² .............................................. H05K 1/12
[52] U.S. Cl. .................................... 339/17 F; 361/398
[58] Field of Search ...................... 339/17 F, 176 MF; 361/398

[56] References Cited

U.S. PATENT DOCUMENTS 3,154,365 10/1964 Crimmins .......................... 339/17 F
4,029,374 6/1977 Nestor et al. ...................... 339/17 F

*Primary Examiner*—Neil Abrams
*Attorney, Agent, or Firm*—Peter Abolins; Clifford L. Sadler

[57] ABSTRACT

This specification discloses a circuit board assembly having a circuit board with a front surface, a contact supporting surface extending rearwardly away from the front surface, a flexible circuit sheet mounted on the front surface with a contact portion which overlies the contact supporting surface and which is accessible from behind the circuit board. A holder removably mounted on the board retains the contact portion of the sheet in contact with the contact supporting surface while allowing access to the contact portion from the behind of the circuit board.

16 Claims, 8 Drawing Figures

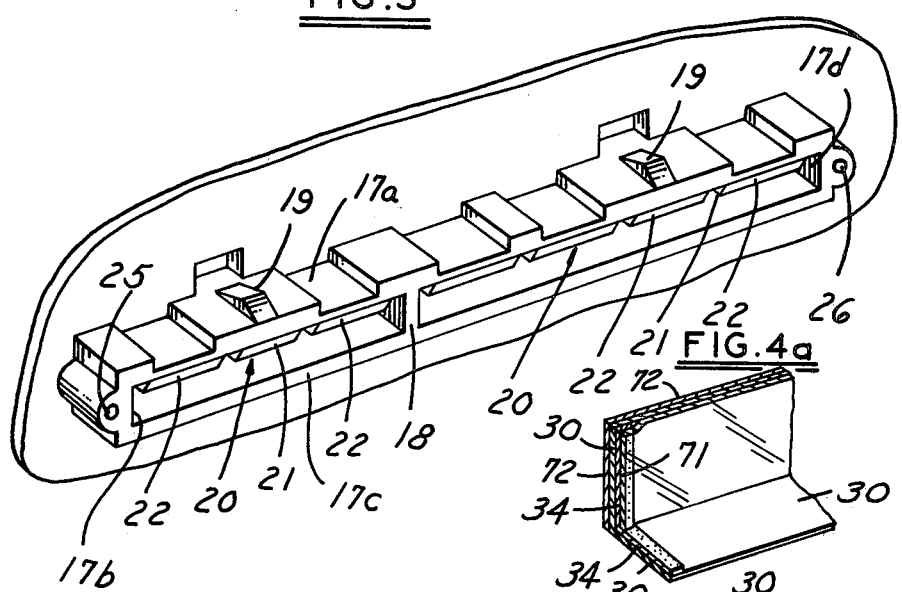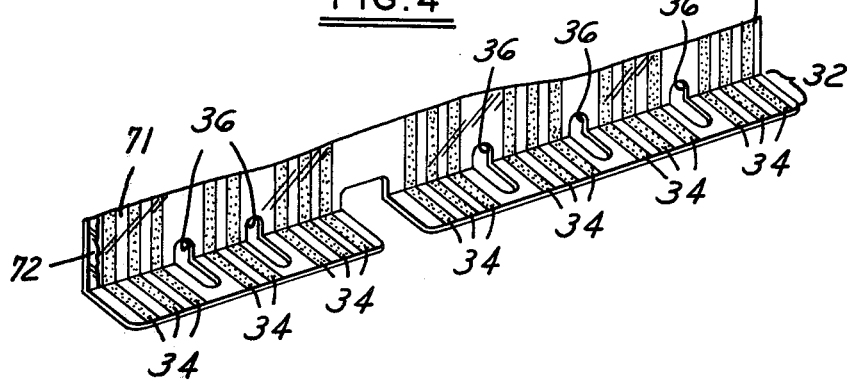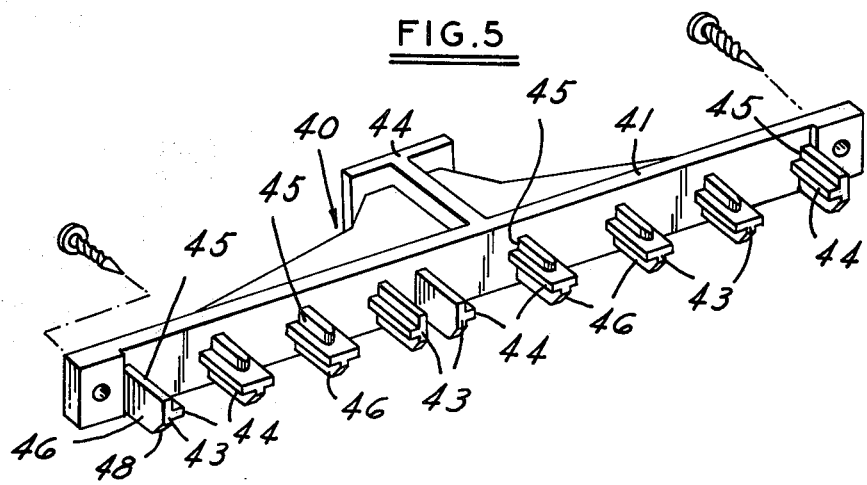

CIRCUIT BOARD ASSEMBLY

BACKGROUND OF THE INVENTION (1) Field of the Invention

This invention relates to circuit board assemblies as used, for example, in an instrument cluster of a motor vehicle to effect internal electrical connections between the individual instruments and a removable plug connected to a wiring harness.

(2) Prior Art

Conventional circuit boards used in such instrument clusters carry a flexible circuit sheet on one surface. This sheet is composed of a number of strips of electrically conductive material, usually copper, mounted on a film of insulating material. A protective coating of insulating material is usually applied over the strips of conductive material. A contact portion of the sheet, usually along one or more edges of the sheet, is however free from insulating material so that the copper strips are exposed for electrical connection to a wiring harness. The circuit sheet is mounted on a rear surface of the circuit board and the contact portion is bent over an edge of the board and lies against a supporting surface which extends forwardly away from the rear surface. Electrical connections to the circuit sheet are made by inserting a plug connected to a wiring harness into the circuit board from the rear side of the board so that contacts in the plug engage with the exposed strips of conductive material on the contact portion of the circuit sheet.

Although this arrangement operates satisfactorily when the plug is connected to the circuit board from the rear of the board, it has been found that a similar arrangement cannot be used when the circuit is mounted on the front of the board because the insertion of the plug into the board tends to strip the circuit sheet from the front surface of the board.

SUMMARY OF THE INVENTION

The present invention provides a circuit board assembly comprising a circuit board having a front surface, a contact supporting surface extending rearwardly away from the front surface, a flexible circuit sheet mounted on the front surface and having a contact portion which overlies the contact supporting surface and which is accessible from behind the circuit board, and a holder removably mounted on the board and retaining the contact portion of the sheet in contact with the contact supporting surface while allowing access to the contact portion from behind of the circuit board.

Advantageously, the circuit board assembly of the invention is used in conjunction with a removable lead plug which is attached to the rear of the circuit board and carries at least one forwardly extending contact, which engages a respective contact on the contact portion of the circuit sheet. Since the holder retains the contact portion of the circuit sheet against the contact supporting surface, the circuit sheet is prevented from being stripped from the board when the plug is attached.

The holder may be mounted on the board by any suitable arrangement. Preferably however, the holder includes one or more fingers extending forwardly therefrom which is slidably engaged in a respective groove extending rearwardly away from the front surface of the board, and parts of the finger or fingers adjacent the groove or grooves hold the contact portion of the circuit sheet in engagement with the contact support surface.

Desirably, the grooves are formed in the contact support surface, and the circuit sheet is perforated in the region of the grooves so that the ends of the fingers engage the circuit sheet.

With this arrangement, insertion of the holder into the circuit board tends to pull the circuit sheet tightly over the front and contact support surfaces.

In the preferred embodiments of the invention, the front surface defines an aperture having rearwardly directed flanges which form a socket receiving the holder, and the contact surface is formed on the inner surface of one flange.

In order to facilitate removal of the holder from the circuit board to effect maintenance, the holder is conveniently provided with a forwardly-projecting finger grip. Advantageously, the socket and holder are shaped to allow insertion of the holder into the aperture in one orientation only.

Where the circuit board is provided with a socket for the holder, the lead plug preferably defines a recess within which the flange of the aperture is slidingly received.

The circuit board itself may be formed as a separate component or as an integral part of a larger component, for which the electrical circuit is required, e.g., a housing for an instrument cluster.

BRIEF DESCRIPTION OF THE DRAWINGS

FIg. 3 is a rear view of part of the board of FIG. 2 in perspective;

FIG. 4 is a perspective view of part of a printed circuit carried by the assembly of FIG. 3;

FIG. 4A is an enlarged perspective view of a portion of FIG. 4 including front and back protective layers;

FIG. 5 is a perspective view of a holder used in conjunction with the circuit board of FIG. 2;

DETAILED DESCRIPTION OF THE INVENTION

Figure 1:
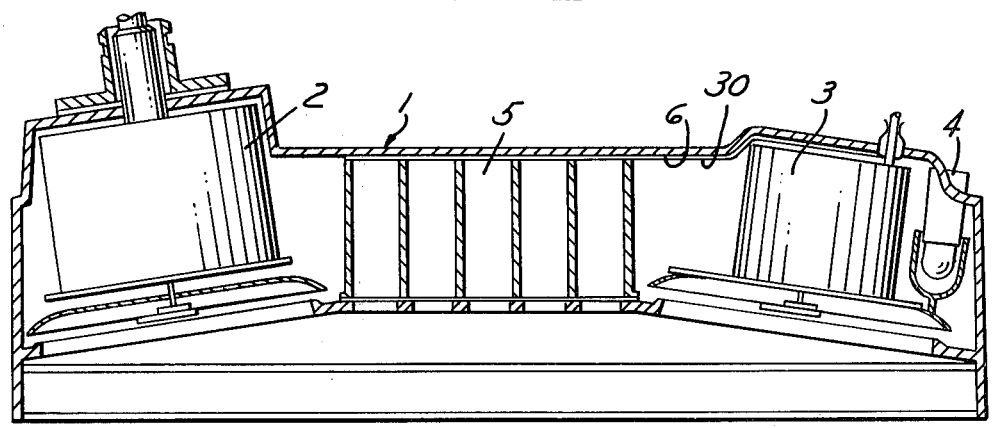
FIG. 1 is a schematic horizontal cross section of a motor vehicle instrument cluster incorporating a circuit board assembly in accordance with the invention.

Referring to FIG. 1, an instrument cluster for a motor vehicle comprises a housing 1 of molded plastics material which is suitably shaped to receive a variety of instruments typically installed in motor vehicles, for example a speedometer 2, a tachometer 3, and a light bulb 4 for illuminating the cluster. Other instruments, e.g., ammeter, temperature gauge, fuel guage and warning lights being housed in the central region 5 of the cluster.

Figure 2:
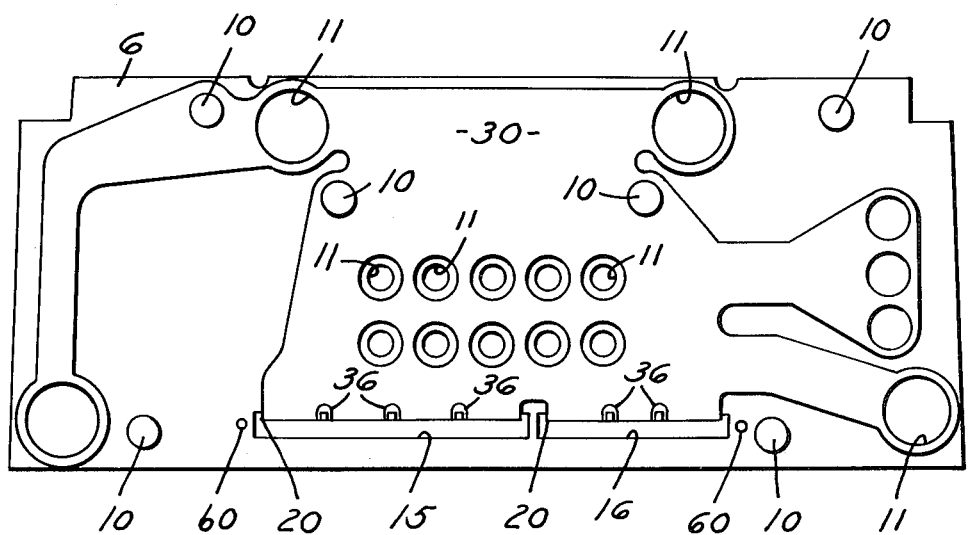
FIG. 2 is a front view of a circuit board incorporated in the cluster of FIG. 1.
Figure 6:
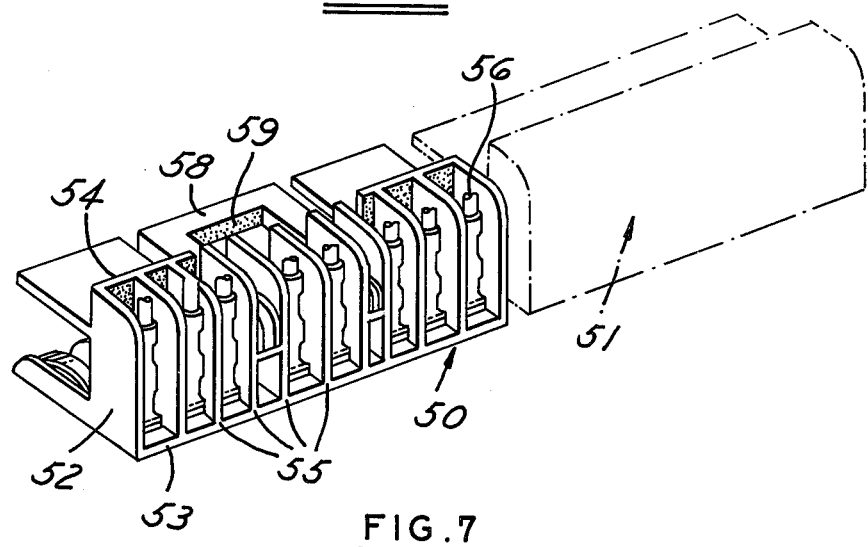
FIG. 6 is a perspective rear view of a lead plug used in conjunction with the assembly.

A circuit board 6 is formed as an integral part of the rear wall 7 of the housing 1, as illustrated in FIG. 2. A number of supporting pillars 10 for the instruments in the cluster project forwardly from the board and the board includes several apertures 11, in which the rear ends of the instruments engage.

Two transverse slot-shaped apertures 15, 16 are defined towards the lower edge of the board 6. As best seen in FIG. 3, each aperture 15, 16 includes rearwardly-directed peripheral flanges 17a, 17b, 17c and 17d. The upper and lower flanges 17a and 17c are connected by a wall 18, so that the apertures and flanges form two rectangular open-ended sockets. The upper exterior surface of the flange 17a carries cams 19 and the upper inner surface carries an integral contact supporting surface 20 which is divided into sections by rearwardly extending slots 21. The rear edge of the supporting surface includes chamfered portions 22 which provide an outwardly flanged rear entrance to the apertures 15, 16. Two threaded bosses 25, 26 are positioned adjacent the side flanges 17b, 17d of the apertures 15, 16.

A flexible circuit sheet 30 overlies part of the front surface of the circuit board 6 and is fixed thereto by pins. The sheet 30 comprises a set of copper conducting strips sandwiched between two layers 71, 72 (see FIG. 4A) of polyester film. The copper strips are arranged in the circuit sheet 30 to provide appropriate electrically conductive paths between a contact portion 32 of the sheet 30 and the points on the circuit board 6 at which the instruments in the cluster are attached. The detailed arrangement of the copper strips on the front surface of the board 6 has been omitted for clarity. The ends 34 of the strips are however illustrated in FIG. 4 at the contact portion 30. The outer layer of polyester film does not cover the ends 34 of the strips in the contact portion 32 of the sheet 30, thus exposing the ends 34 for connection into an electrical circuit.

As seen in FIGS. 2 and 4, the contact portion 32 extends over the upper edges of the apertures 15, 16 and overlies the contact support surface 20. The sheet 30 contains a set of perforations 36 which register with the slots or grooves 21 in the contact support surface 20 and allow access thereto from the front of the circuit board 6.

Figure 7:
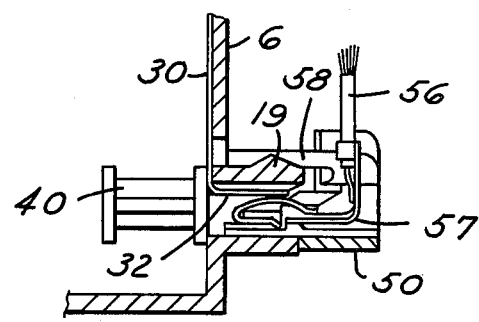
FIG. 7 is a cross section of the circuit board showing the holder and a lead plug in position on the circuit board.
Figure 8:
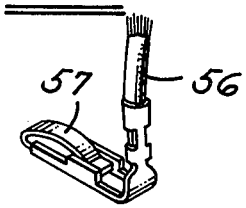
FIG. 8 is a perspective view of a terminal incorporated in the plug shown in FIG. 6.

The contact portion of the circuit sheet is held in contact with the support surface 20 by means of a holder 40 (FIGS. 5 and 7). The holder comprises a strip of insulating material 41 from one side of which a set of fingers 43 extend rearwardly. A finger grip 44 extends forwardly from the outer side of the strip 41.

Each finger 43 comprises horizontal platform 44. A rib 45 extends along the upper surface of the platform 44 and is complementary in shape to the grooves 21 in the supporting surface 20, the horizontal spacing between the ribs 45 being equal to that between the grooves 21.

A spacer 46 (FIG. 5) extends beneath the platform 44 into abutment with the lower flange 17d of the apertures 15, 16. The lower rearward end of each finger is chamfered, as shown at 48 in FIG. 5, to assist in insertion of the holder with the apertures 15, 16. The spacing of the fingers 43 and the relative proportions of the ribs 45, platforms 44 and spacers 46 are all asymmetrical so that the holder 40 can be inserted into the apertures 15, 16 in one orientation only.

Two lead plugs 50, 51 are mounted on the rear of the circuit board. Each lead plug comprises an electrically insulating body 52, each of which comprises a base plate 53 and an upstanding wall 54. The region rearwardly of the wall 52 is divided into compartments by partitions 55. A lead wire 56 extends into each compartment and is connected electrically to a spring contact 57 which extends forwardly through the wall 54. A latch plate 58 also extends forwardly from the wall 54 above the contacts 57. The latch plate 58 defines a rectangular aperture 59 which registers with the cam 19 to retain the plug on the flanges 17a, 17c.

In assembling the circuit board, the holder is inserted into the apertures 15, 16 so that the ribs 45 engage in the grooves 21 in the contact supporting surface 20. The platforms 44 engage the regions of the circuit sheet adjacent the grooves 21 and hold the sheet firmly against the supporting surface. Additionally, the ends of the ribs 45 engage with the ends of the perforations in the circuit sheet and pull the sheet taut over the contact surface 20. Although the frictional engagement of the fingers of the holder within the apertures 15, 16 may be sufficient to retain the holder in position, the holder can be fixed permanently to the circuit board by screws which pass through holes 60 at the ends of the holder and into the bosses 25, 26.

The plugs can then be mounted on the flanges by pushing the plugs onto the flanges of the aperture so that the latch plate 58 engages with the cam surface 19. In this position, the contacts enter the aperture from the rearward direction, and their entry is facilitated by the chamfered rear surface of the flanges. Since the circuit sheet is at all times held firmly against the supporting surface 20 by the holder, there is no risk of the circuit sheet becoming detached from the board 6.

Various modifications and variations will no doubt occur to those skilled in the various arts to which this invention pertains. For example, the particular configuration of the holder and the aperture may vary in shape from that described herein. These and all other variations which basically rely on the teachings through which this disclosure has advanced the art are properly considered within the scope of this invention.

We claim:

1. A circuit board assembly comprising a circuit board having a front surface, a contact supporting surface extending rearwardly away from said front surface, a flexible circuit sheet mounted on said front surface and having a contact portion which overlies said contact supporting surface and which is accessible from behind said circuit board and a holder removably mounted on said circuit board and retaining said contact portion of said sheet in contact with said contact supporting surface while allowing access to said contact portion from behind of said circuit board; and said contact support surface having formed therein a respective groove extending rearwardly away from the front surface of said circuit board and said holder including at least one finger extending forwardly from said holder which is slidably engaged in said respective groove, and parts of said at least one finger adjacent said respective groove holding the contact portion of said circuit sheet in engagement with said contact support surface.

2. A circuit board assembly according to claim 1 further comprising a removable lead plug mounted on the rear of said circuit board and carrying at least one forwardly projecting contact, which engages with a respective contact on the contact portion of the circuit sheet.

3. A circuit board assembly according to claim 2 wherein said contact support surface has formed therein a respective groove extending rearwardly away from the front surface of said circuit board and said holder includes at least one finger extending forwardly therefrom which is slidably engaged in said respective groove, and parts of said at least one finger adjacent said respective groove hold the contact portion of said circuit sheet in engagement with said contact support surface.

4. A circuit board assembly according to claim 3 wherein said circuit sheet is perforated in the region of said respective groove so that the end of said finger engages said circuit sheet.

5. A circuit board assembly according to claim 4 wherein said front surface defines an aperture having adjacent rearwardly directed flanges which form a socket receiving said holder, and said contact portion is positioned on the inner surface of one flange.

6. A circuit board assembly according to claim 1 wherein said front surface defines an aperture having adjacent rearwardly directed flanges which form a socket receiving said holder, and said contact portion is positioned on the inner surface of one flange.

7. A circuit board assembly according to claim 5 wherein said socket and said holder are shaped to allow insertion of said holder into said socket in one orientation only.

8. A circuit board assembly according to claim 7 wherein said lead plug is slidably mounted on the flanges of the aperture.

9. A circuit board assembly as recited in claim 8 wherein said socket, as defined by said aperture and said rearwardly directed flanges, is divided into sections by a wall extending across said socket.

10. A circuit board assembly as recited in claim 9 wherein said contact supporting surface is divided into sections by rearwardly extending slots, the rear edge of said contact supporting surfaces including a chamfered portion thereby providing an outwardly flanged rear entrance to said aperture.

11. A circuit board assembly as recited in claim 10 wherein said flexible circuit sheet includes a set of copper conducting strips sandwiched between two layers of polyester film, the outer layer of polyester film not covering the ends of said copper conducting strips extending into said contact portion thereby exposing the ends of said copper conducting strips for connection into an electrical circuit.

12. A circuit board assembly as recited in claim 1 wherein said flexible circuit sheet includes perforations for registering with said grooves in said contact support surface and thereby allowing access to said contact support surface from the front of said circuit board.

13. A circuit board assembly as recited in claim 11 wherein said holder includes a plurality of fingers, each finger including a horizontal platform, and a rib extending along the upper surface of said horizontal platform and is complementary in shape to said slots and said contact supporting surface, the horizontal spacing between said ribs being equal to that between said slots.

14. A circuit board assembly as recited in claim 13 further comprising a spacer extending beneath said horizontal platform into abutment with the lower of said flanges of said aperture, and the lower rearward end of each of said fingers being chamfered thereby assisting insertion of said holder into said aperture.

15. A circuit board assembly as recited in claim 14 wherein said lead plug includes:
an electrically insulating body having a base plate and an upstanding wall, the region rearward of said wall being divided into compartments by partitions;
a lead wire extending into each compartment; and
a spring contact positioned adjacent to said compartment and electrically connected to said lead wire.

16. A circuit board assembly as recited in claim 15 wherein said holder includes a forwardly projecting finger grip for providing a convenient place to grasp said holder to facilitate removal of said holder from said circuit board.

* * * * *